(12) United States Patent
Kato (10) Patent No.: US 9,390,808 B1
(45) Date of Patent: Jul. 12, 2016

(54) SEMICONDUCTOR MEMORY DEVICE

(71) Applicant: KABUSHIKI KAISHA TOSHIBA, Minato-ku, Tokyo (JP)

(72) Inventor: Koji Kato, Yokohama Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/964,338

(22) Filed: Dec. 9, 2015

Related U.S. Application Data

(60) Provisional application No. 62/217,650, filed on Sep. 11, 2015.

(51) Int. Cl.
*G11C 16/06* (2006.01)
*G11C 16/34* (2006.01)
*G11C 16/14* (2006.01)
*G11C 16/26* (2006.01)

(52) U.S. Cl.
CPC ............ *G11C 16/3445* (2013.01); *G11C 16/14* (2013.01); *G11C 16/26* (2013.01)

(58) Field of Classification Search
CPC ...................................................... G11C 16/06
USPC .................................................. 365/185.22
See application file for complete search history.

(56) References Cited

U.S. PATENT DOCUMENTS

| 7,535,763 | B2* | 5/2009 | Hemink | G11C 11/5621 365/185.19 |
|---|---|---|---|---|
| 7,697,338 | B2* | 4/2010 | Hemink | G11C 11/5628 365/185.19 |
| 7,911,849 | B2* | 3/2011 | Hemink | G11C 11/5628 365/185.19 |
| 2008/0117683 | A1* | 5/2008 | Hemink | G11C 11/5621 365/185.19 |
| 2008/0117684 | A1* | 5/2008 | Hemink | G11C 11/5628 365/185.19 |
| 2009/0296475 | A1 | 12/2009 | Hemink et al. | |
| 2010/0195397 | A1* | 8/2010 | Hemink | G11C 11/5628 365/185.17 |
| 2012/0206972 | A1 | 8/2012 | Shiino et al. | |

FOREIGN PATENT DOCUMENTS

JP     2012195051 A     10/2012

* cited by examiner

*Primary Examiner* — Harry W Byrne
(74) *Attorney, Agent, or Firm* — Holtz, Holtz & Volek PC (57) ABSTRACT

According to one embodiment, a semiconductor memory device includes a memory cell transistor and a word line connected to the memory cell transistor. A threshold voltage of the memory cell transistor is shifted to a negative voltage side by applying an erase pulse to the memory cell transistor. When the erase pulse is applied, if the threshold voltage of the memory cell transistor is higher than or equal to a first voltage, a second voltage is applied to the word line. If the threshold voltage of the memory cell transistor is lower than the first voltage and higher than or equal to a third voltage which is lower than the first voltage, a fourth voltage which is higher than the second voltage is applied to the word line.

14 Claims, 9 Drawing Sheets

| First erase verify | Second erase verify | Erase verify determination circuit (signal EVCG) |
|---|---|---|
| Fail | — | "L" |
| Pass | Fail | "H" |
| Pass | Pass | "L" |

SEMICONDUCTOR MEMORY DEVICE

CROSS-REFERENCE TO RELATED APPLICATIONS

This application claims the benefit of U.S. Provisional Application No. 62/217,650, filed Sep. 11, 2015, the entire contents of which are incorporated herein by reference.

FIELD

Embodiments described herein relate generally to a semiconductor memory device.

BACKGROUND

A NAND flash memory is knows as a semiconductor memory device.

DETAILED DESCRIPTION

In general, according to one embodiment, a semiconductor memory device includes a memory cell transistor and a word line coupled to the memory cell transistor. A threshold voltage of the memory cell transistor is shifted to a negative voltage side by applying an erase pulse to the memory cell transistor. When the erase pulse is applied, if the threshold voltage of the memory cell transistor is higher than or equal to a first voltage, a second voltage is applied to the word line. If the threshold voltage of the memory cell transistor is lower than the first voltage and higher than or equal to a third voltage which is lower than the first voltage, a fourth voltage which is higher than the second voltage is applied to the word line.

In the following embodiments, a planar NAND flash memory in which memory cell transistors are arranged two dimensionally on a semiconductor substrate will be described as an example of a semiconductor memory device.

1 First Embodiment

A semiconductor memory device according to a first embodiment will be described.

1.1 Regarding Overall Structure of Semiconductor Memory Device

Figure 1:
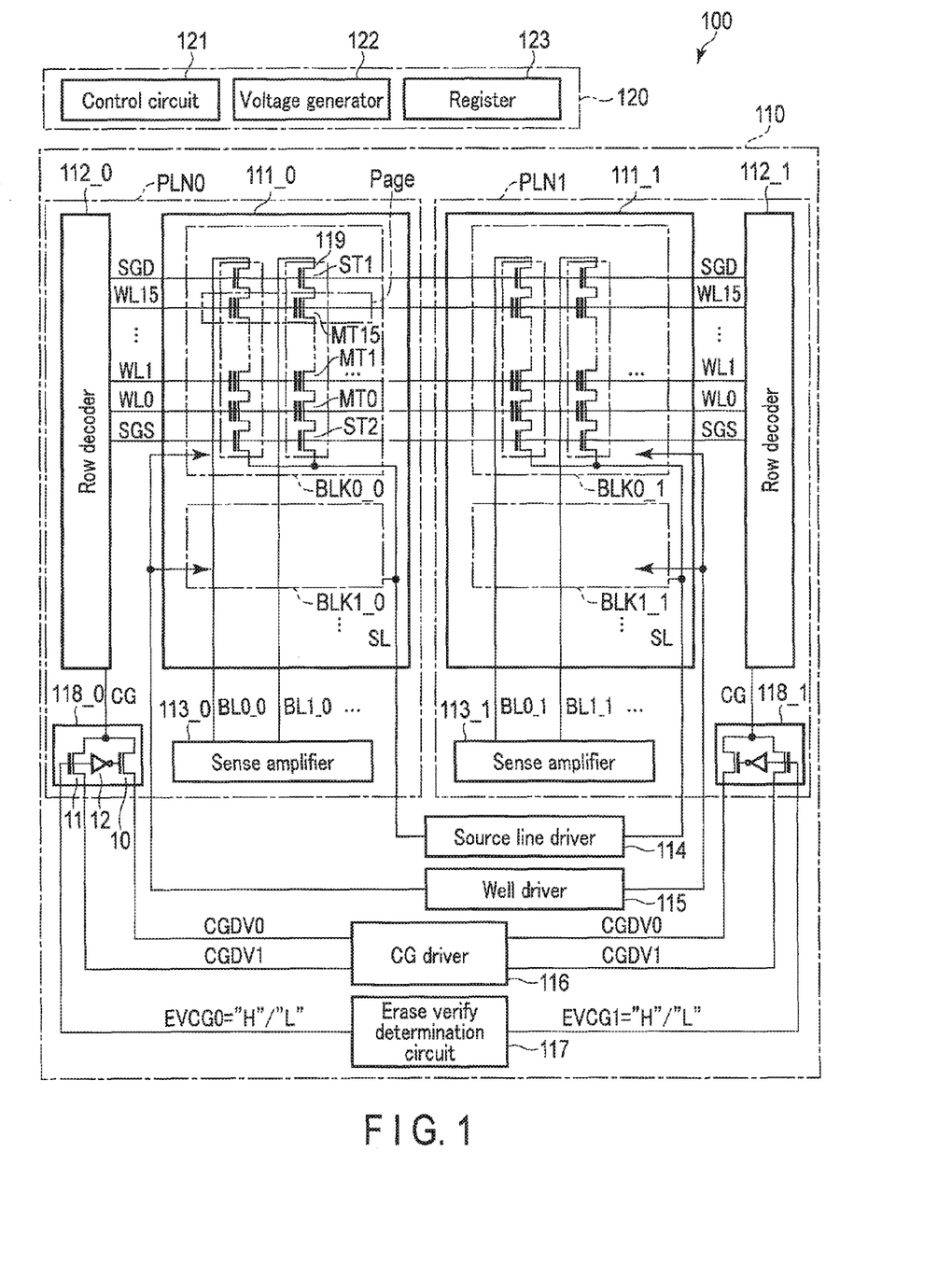
FIG. 1 is a block diagram showing the overall structure of a semiconductor memory device according to a first embodiment.

FIG. 1 is a block diagram showing the overall structure of a semiconductor memory device according to a first embodiment. In FIG. 1, some of the connections between blocks are indicated by arrows, but the connections between blocks are not limited to those indicated by arrows. One end of a transistor corresponds to one of a source and a drain and the other end thereof corresponds to the other of a source and a drain.

As shown in FIG. 1, a NAND flash memory 100 of the first embodiment includes a core unit 110 and a peripheral circuit unit 120. The core unit 110 includes two planes PLN0 and PLN1, a source line driver 114, a well driver 115, a CG driver 116 and an erase verify determination circuit 117.

The planes PLN are units for writing data to a memory cell transistor MT and reading data out of the memory cell transistor MT. The planes PLN0 and PLN1 can be operated independently of each other or simultaneously. In the first embodiment, the NAND flash memory 100 includes two planes; however, the number of planes PLN is not limited to two but can be one or three or more. The planes will be described in detail later.

The source line driver 114 applies a voltage to a source line SL of each of the planes PLN.

The well driver 115 applies a voltage to a p-type well region (namely a back gate of the memory cell transistor MT) of a semiconductor substrate on which the memory cell transistors MT of each of the planes PLN are formed.

The CG driver 116 applies a voltage to a row decoder 112 of each of the planes PLN. More specifically, the CG driver 116 is able to apply different voltages to CG driver lines CGDV0 and CGDV1 connected to the CG driver 116. In 20 each of the planes PLN, one of the CG driver lines CGDV0 and CGDV1 is connected to a row decoder 112 via a CG selector 118. Thus, in each of the planes PLN, the CG driver 116 applies one of two voltages applied to the CG driver lines CGDV0 and CGDV1 to the row decoder 112 via the CG selector 118.

The erase verify determination circuit 117 outputs a signal EVCG (EVCG0 and EVCG1) to the CG selector 118 of each of the planes PLN on the basis of a result of erase verify in an erase operation. More specifically, the erase verify determination circuit 117 transmits the signal EVCG0 to a CG selector 118_0 of the plane PLN0 based on a result of erase verify in the plane PLN0 and transmits the signal EVCG1 to a CG selector 118_1 of the plane PLN1 based on a result of erase verify in the plane PLN1.

The peripheral circuit unit 120 includes a control circuit 121, a voltage generator 122 and a register 123.

The control circuit 121 controls the whole operation of the NAND flash memory 100.

The voltage generator 122 generates a voltage necessary to write, read and erase data and applies the necessary voltage to a sense amplifier 113, the source line driver 114, the well driver 115, the CG driver 116 and the like.

The register 123 holds various signals. For example, the register 123 holds status of data write and erase operation and thus notifies an external controller whether the operation is normally completed or not. The register 123 is able to hold various tables.

1.1.1 Structure of Planes

The structure of the planes will be described using FIG. 1 again.

Each of the planes PLN includes a memory cell array 111, the row decoder 112, the sense amplifier 113 and the CG selector 118. Hereinafter, in order to distinguish between the planes PLN0 and PLN1, the memory cell array of the plane PLN0 will be represented as 111_0, the row decoder thereof is represented as 112_0, the sense amplifier thereof is represented as 113_0 and the CG selector thereof is represented as 118_0. Similarly, the memory cell array of the plane PLN1 is represented as 111_1, the row decoder thereof is represented as 112_1, the sense amplifier thereof is represented as 113_1 and the CG selector thereof is represented as 118_1.

The memory cell array 111 includes a plurality of blocks BLK which is a set of a plurality of nonvolatile memory cell transistors. For example, the data held by the memory cell transistor MT is erased for each of the blocks BLK. Hereinafter, in order to distinguish between the planes PLN0 and PLN1, the blocks BLK of the plane PLN0 will be represented as BLKm_0 (m is an integer greater than or equal to 0) and the blocks BLK of the plane PLN1 are represented as BLKm_1. The range of data erase is not limited to one block BLK in one plane PLN, but a plurality of blocks BLK can be erased at once and part of one block BLK can be erased at once. Furthermore, the number of blocks BLK in each of the planes PLN may vary; thus, it is not limited.

Each of the blocks BLK includes a plurality of NAND strings 119 each including memory transistors connected in series. Each of the NAND strings 119 includes, for example, sixteen memory cell, transistors MT (MT0 to MT15) and select transistors ST1 and ST2. The memory cell transistor MT includes a control gate and a charge accumulation layer and holds data nonevolatilely. The memory cell transistor MT may be of an MONOS type using an insulation film for the charge accumulation layer or an FG type using a conductive film for the charge accumulation layer. Moreover, the number of memory cell transistors MT is not limited to 16 but may be 8, 32, 64, 128 or the like; thus, it is not limited.

The memory cell transistors MT0 to MT15 are connected in series as a current path. The drain of the memory cell transistor MT15 at one end of the series connection is connected to the source of the select transistor ST1, and the source of the memory cell transistor MT0 at the other end thereof is connected to the drain of the select transistor ST2.

The gates of the select transistors ST1 in the same block BLK are connected to a common select gate line SGD. Similarly, the gates of the select transistors ST2 in the same block BLK are connected to a common select gate line SGS.

The control gates of memory cell transistors MT in each of the NAND strings 119 in a block BLK are connected to their respective word lines WL0 to WL15.

In each of the planes PLN, the drains of the select transistors ST1 in the NAND strings 119 in the same column are connected to a common bit line DL. In other words, a bit line BL is connected in common to the NAND strings 119 among a plurality of blocks BLK. Hereinafter, in order to distinguish between the planes PLN0 and PLN1, the bit lines BL of the plane PLN0 will be represented as BLk_0 (k is an integer greater than or equal to 0) and the bit lines BL of the plane PLN1 are represented as BLk_1. The number of bit lines BL may vary between plane 0 and plane 1; thus, it is not limited.

The sources of the select transistors ST2 in the blocks BLK in the plane PLN are connected to a common source line SL.

The source lines SL of the planes PLN0 and PLN1 are connected to a common source line driver 114.

The row decoder 112 decodes an address of a block BLK and an address of a page when data is written, read, erased or the like and selects a target word line WL. Then, the row decoder 12 applies an appropriate voltage to the word line WL and select gate lines SGD and SGS.

In data read operation, the sense amplifier 113 senses data read out from a memory cell transistor to a bit line BL. In data write operation, the sense amplifier 113 transfers write data to the memory cell transistor MT.

The CG selector 118_0 selects one of the CG driver lines CGDV0 and CGDV1 on the basis of a signal EVCG0 input from the erase verify determination circuit 117 to connect the row decoder 112_0 and the CG driver 116. Similarly, the CG selector 118_1 selects one of the CG driver lines CGDV0 and CGDV1 on the basis of a signal EVCG1 input from the erase verify determination circuit 117 to connect the row decoder 112_1 and the CG driver 116. In other words, the CG selectors 118_0 and 118_1 are able to apply different voltages to the row decoders 112_0 and 112_1 on the basis of signals EVCG0 and EVCG1. It is thus possible to apply different voltages to the word lines WL of the planes PLN0 and PLN1.

The CS selector 118 includes n-channel MOS transistors 10 and 11 and an inverter 12. More specifically, one end of a transistor 10 of the CG selector 118_0 and one end of a transistor 11 thereof are connected to each other, and they are connected to the row decoder 112_0 via a control gate line CG. The other end of the transistor 10 is connected to the CG driver 116 via the CG driver line CSDV0 and the other end of the transistor 11 is connected to the CS driver 116 via the CG driver line CGDV1. The gate of the transistor 10 is supplied with a signal EVCG0 and the gate of the transistor 11 is supplied with a signal EVCG0 inverted by the inverter 12. Similarly, one end of a transistor 10 of the CS selector 118_1 and one end of a transistor 11 thereof are connected to each other, and they are connected to the row decoder 112_1 via a control gate line CG. The other end of the transistor 10 is connected to the CG driver 116 via the CG driver line CGDV0 and the other end of the transistor 11 is connected to the CG driver 116 via the CG driver line CGDV1. The gate of the transistor 10 is supplied with a signal EVCG1 and the gate of the transistor 11 is supplied with a signal EVCG1 inverted by the inverter 12.

In the CG selector 118_0, for example, when the signal EVCG0 is set at an "H" level, the transistor 11 is turned on and the transistor 10 is turned off. Thus, the row decoder 112_0 is connected to the CG driver 116 via the CG driver line CGDV1. When the signal EVCG0 is set at an "L" level, the transistor 10 is turned on and the transistor 11 is turned off. Thus, the row decoder 112_U is connected to the CG driver 116 via the CG driver line CGDV0.

1.1.2 Structure of Sense Amplifier

Figure 2:
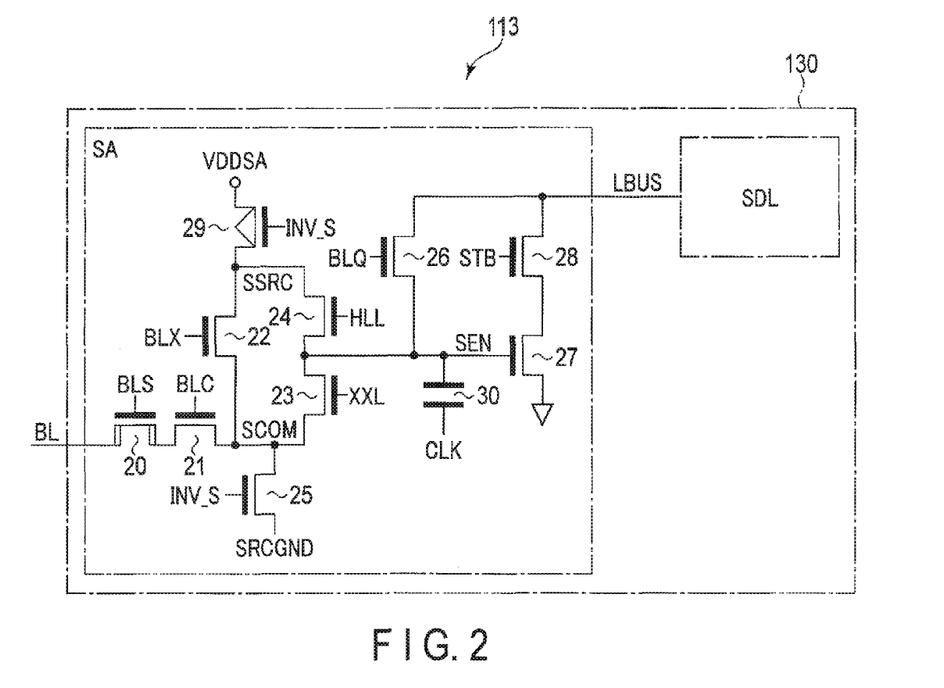
FIG. 2 is a circuit diagram of a sense amplifier in the semiconductor memory device according to the first embodiment.

Below is a description of the structure of the sense amplifier 113. FIG. 2 is a circuit diagram of a sense amplifier in the semiconductor memory device according to the first embodiment. In this embodiment, a sense amplifier unit 130 of a current sense system will be described. The sense amplifier 113 includes sense amplifier units 130 the number of which is the same as that of bit lines BL.

As shown in FIG. 2, the sense amplifier unit 130 includes a sense circuit. SA and a latch circuit SDL. When each of the memory cell transistors MT holds data of two or more bits, two or more latch circuits are provided.

In the data read operation, the sense circuit SA senses data read to the bit line BL. In the data write operation, the sense circuit SA applies a voltage to the bit line BL in accordance with data held in the latch circuit SDL. The latch circuit SDL temporally holds data. In data write operation, the latch circuit SDL holds write data received from the external controller. In data read operation, the latch circuit SDL holds data sensed by the sense circuit SA and transmits the held data to the external controller.

The sense circuit SA includes n-channel MOS transistors 20-28, a p-channel MOS transistor 29 and a capacitor element 30.

One end of a transistor 20 is connected to its corresponding bit line BL, the other end thereof is connected to one end of a transistor 21, and the gate thereof is supplied with a signal BLS.

The other end of the transistor 21 is connected to a node SCOM, and the gate thereof is supplied with a signal BLC. The transistor 21 is used to clamp the voltage of its corresponding bit line BL in accordance with the potential of the signal BLC.

One end of a transistor 25 is connected to the node SCUM, the other end thereof is connected to a node SRCGND, and the gate thereof is supplied with a signal INV_S.

One end of a transistor 22 is connected to the node SCOM, the other end thereof is connected to a node SSRC, and, the gate thereof is supplied with a signal BLX.

One end of a transistor 29 is connected to the node SSRC, a voltage VDDSA is applied to the other end of the transistor 29, and the gate of the transistor 29 is supplied with a signal INV_S. VDDSA is a power supply voltage that is applied to the sense amplifier 113 by the voltage generator 122.

One end of a transistor 23 is connected to the node SCOM, the other end thereof is connected to a node SEN, and the gate thereof is supplied with a signal XXL.

One end of a transistor 24 is connected to the node SSRC, the other end thereof is connected to the node SEN, and the gate thereof is supplied with a signal HLL.

One end of a transistor 27 is connected to one end of a transistor 28, the other end thereof is grounded, and the gate thereof is connected to the node SEN.

The other end of the transistor 28 is connected to a bus LBUS, and the gate thereof is supplied with a signal STB.

One end of a transistor 26 is connected to the node SEN, the other end thereof is connected to the bus LBUS, and the gate thereof is supplied with a signal BLQ.

One electrode of the capacitor element 30 is connected to the node SEN, and the other electrode thereof is supplied with a clock CLK.

1.1.3 Determination Table of Erase Verify Determination Circuit

Figure 3:
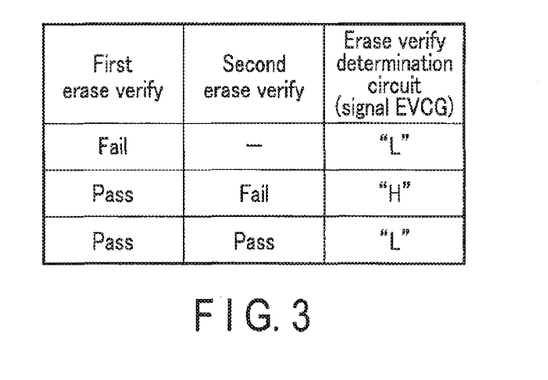
FIG. 3 is a determination table of an erase verify determination circuit in the semiconductor memory device according to the first embodiment.

Below is a description of a determination table for use in a determination operation of the erase verify determination circuit 117. FIG. 3 is a determination table of the erase verify determination circuit. 117 in the semiconductor memory device according to the first embodiment. In the NAND flash memory 100, for example, the register 123 includes a determination table. The verify determination circuit 117 determines an erase verify result for each plane PLN on the basis of the determination table.

As shown in FIG. 3, the determination table holds information indicating a relationship between determination results of first and second erase verify described later and the signal EVCG.

For example, when the first erase verify is failed, the erase verify determination circuit 117 sets the signal VCG at an "1" level irrespective of a result of the second erase verify. In this case, the CG selector 118 connects the CG driver line CGDV0 and the control gate line CG.

When the first erase verify is passed and the second erase verify is failed, the erase verify determination circuit 117 sets the signal EVCG at an "H" level. In this case, the CG selector 118 connects the CG driver line CGDV1 and the control gate line CG.

When the first and second erase verify are passed, the erase verify determination circuit 117 maintains the signal EVCG at a preset initial state, e.g., an "L" level. However, the erase operation is completed and thus the CG driver 116 does not apply a voltage to the row decoder 112.

1.2 Data Erase Operation

Below is a description of a data erase operation according to the first embodiment. The erase operation includes an operation for applying an erase pulse to lower the threshold voltage of the memory cell transistor MT and an erase verify operation for determining whether the threshold voltage of the memory cell transistor MT becomes lower than a target value as a result of application of the erase pulse.

The application of an erase pulse in the first embodiment includes two erase modes called "normal mode" and "slow mode" and the erase verify includes two verify operations called "first erase verify" and "second erase verify". The voltage of the word line WI in normal mode is different from the voltage of the word line WL in slow mode. The voltage of the word line WL in the first erase verify is different from the voltage of the word line WI in the second erase verify. Specifically, the voltage of the word line WI in slow mode is higher than that in normal mode. The amount of variation in threshold voltage of the memory cell transistor MT due to the application of an erase pulse in slow mode is smaller. The voltage of the word line WL in the second erase verify is lower than that in the first erase verify. In other words, the verify level (determination voltage of verify) in the second erase verify is lower than that in the first erase verify. Hereinafter, the erase operation will be described in detail.

1.2.1 Flow of Whole Erase Operation

Figure 4:
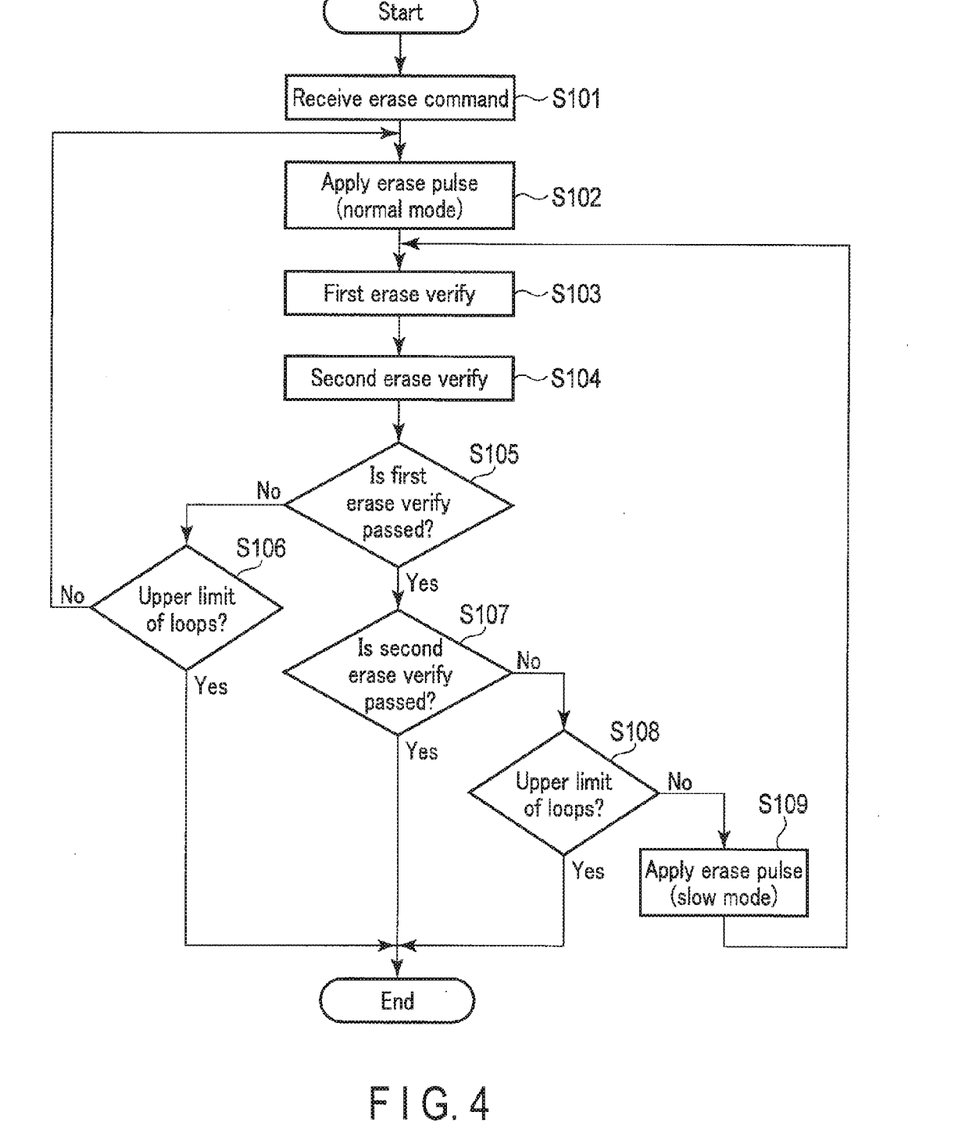
FIG. 4 is a flowchart showing an erase operation in the semiconductor memory device according to the first embodiment.

Below is a description of a flow of the whole erase operation. FIG. 4 is a flowchart showing an erase operation in the semiconductor memory device according to the first embodiment.

As shown in FIG. 4, first, the control circuit 121 receives an erase command from an external controller (step S101).

Then, the control circuit 121 selects the normal mode to apply an erase pulse (step S102).

Next, the control circuit 121 performs the first erase verify (step S103). Hereinafter, a state in which it is determined that data of the memory cell transistor MT is erased, will be referred to as "erase verify is passed" and a state in which it is determined that data has not yet been erased completely, will be referred to as "erase verify is failed".

Next, the control circuit 121 performs the second erase verify (step S104).

When the first erase verify is failed (step S105_No), the control circuit 121 determines whether the number of erase loops has reached a preset upper limit (step S106). Hereinafter, a repetition of erase pulse application and erase verify will be referred to as "erase loop". The control circuit 121 repeats the erase pulse application and the erase verify until the erase verify is passed or the number of erase loops reaches the upper limit.

When the number of erase loops has reached the upper limit (step S106_Yes), the control circuit 121 completes the erase operation and notes the external controller that the erase operation was not normally completed.

When the erase loop has not reached the upper limit (step S106_No), the control circuit. 121 returns to step S102 and selects the normal mode again to apply an erase pulse. More specifically, in accordance with a command of the control circuit 121, for example, the CG driver 116 applies a word line voltage corresponding to the normal mode to the CG driver line CGDV0 and applies a word line voltage corresponding to the slow mode to the CG driver line CGDV1. The erase verify determination circuit 117 sets the signal EVCG at an "1," level on the basis of a result of the first verify. The CG selector 118 electrically connects the CG driver line CGDV0 and the control gate line CG in response to the signal EVCG. As a result, the row decoder 112 applies a voltage corresponding to the normal mode to the word line WL.

When the first erase verify is passed (step S105_Yes), the control circuit 121 confirms a result of the second erase verify (step S107).

When the second erase verify is failed (step S107_No) the control circuit 121 determines whether the number of erase loops is a preset upper limit (step S108).

When the erase loop has reached the upper limit (step S108_Yes), the control circuit. 121 completes the erase operation and notifies the external controller that the erase operation was not normally completed.

When the erase loop has not reached the upper limit (step S108_No), the control circuit 121 selects the slow mode to apply an erase pulse (step S109). More specifically, for example, the erase verify determination circuit 117 sets the signal EVCG at an "H" level on the basis of a result of the first verify and the second verify. The CG selector 118 electrically connects the CG driver line CGDV1 and the control gate line CG in response to the signal EVCG. As a result, the row decoder 112 applies a voltage corresponding to the slow mode to the word line WL.

Then, the control circuit 121 returns to step S103 to perform the first erase verify.

When the second erase verify is passed (step S107_Yes), the erase operation is completed.

1.2.2 Threshold Determination of Erase Verify

Figure 5:
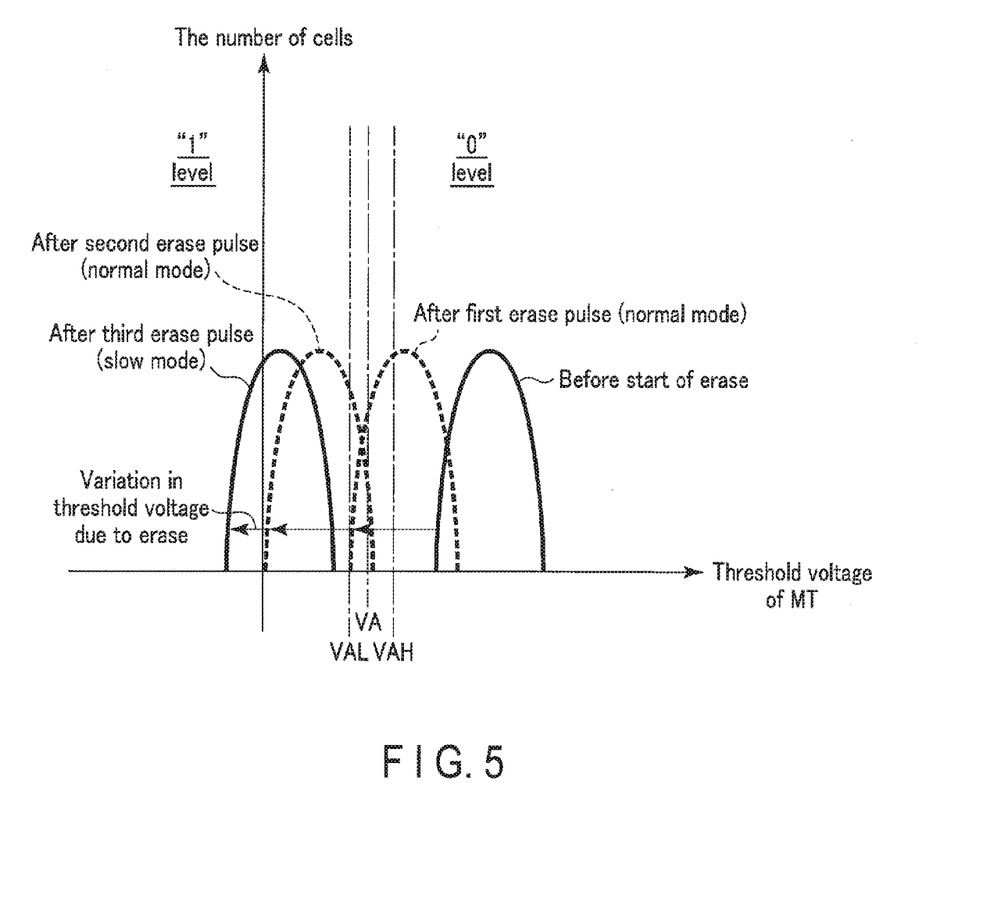
FIG. 5 is a threshold distribution chart of memory cell transistors MT in the semiconductor memory device according to the first embodiment.

Below is a description of threshold determination of the erase verify. FIG. 5 is a threshold distribution chart of the memory cell transistors MT in the semiconductor memory device according to the first embodiment. In the example of FIG. 5, the erase operation is completed by applying an erase pulse three times. In this embodiment, the memory cell transistor MT holds data of one bit; however, it may hold data of two or more bits and thus the number of bits to be held is not limited.

As shown in FIG. 5, the "1" level corresponds to an erase state (erase level) of data and the "0" level corresponds to a state (write level) in which data is written by injecting charges into the charge accumulation layer of the memory cell transistor MT. The threshold voltage of the "1" level is a positive or negative value and is a low value that is lower than voltage VA. The threshold voltage of the "0" level is a high value that is higher than or equal to voltage A. In the first embodiment, a verify level corresponding to the first erase verify is represented as VAH and a verify level corresponding to the second erase verify is represented as VAL. The voltages VA, VAL and VAH have the relationship of VAH>VA>VAL. In the erase verify, the threshold voltage of the memory cell transistor MT after an erase pulse is applied is compared with the verify level, and it is determined whether the threshold voltage is lower than or equal to a target threshold level or not. The voltages VA, VAL and VAH may have the relationship of, e.g., VAL=VA or VAH=VA and thus they can be set optionally.

In the threshold distribution after a first erase pulse is applied in normal mode, there are memory cell transistors MT whose threshold voltage is higher than the verify level VAH and thus the first erase verify is failed. In other words, the threshold distribution widely differs from a target erase level. Therefore, the control circuit 121 selects a normal mode in which the amount of variation in threshold voltage is large, and applies a second erase pulse.

In the threshold distribution after the second erase pulse is applied, there is no memory cell transistor MT whose threshold voltage is higher than the verify level VAH; thus, the first erase verify is passed. However, there are memory cell transistors MT whose threshold voltages are higher than the verify level VAL and thus the second erase verify is failed. In other words, the threshold distribution exhibits a level that is slightly higher than a target erase level. Therefore, the control circuit 121 selects the slow mode in which the amount of variation in threshold voltage is small, and applies a third erase pulse.

In the threshold distribution after the third erase pulse is applied, there is no memory cell transistor MT whose threshold voltage is higher than the verify level VAL; thus, the second erase verify is passed. In the third erase pulse application, the control circuit 121 selects the slow mode and applies the third erase pulse; thus, the threshold voltage is not shifted to the negative voltage side (direction) more greatly than when the normal mode is selected.

1.2.3 Voltages in Erase Pulse Application

Figure 6:
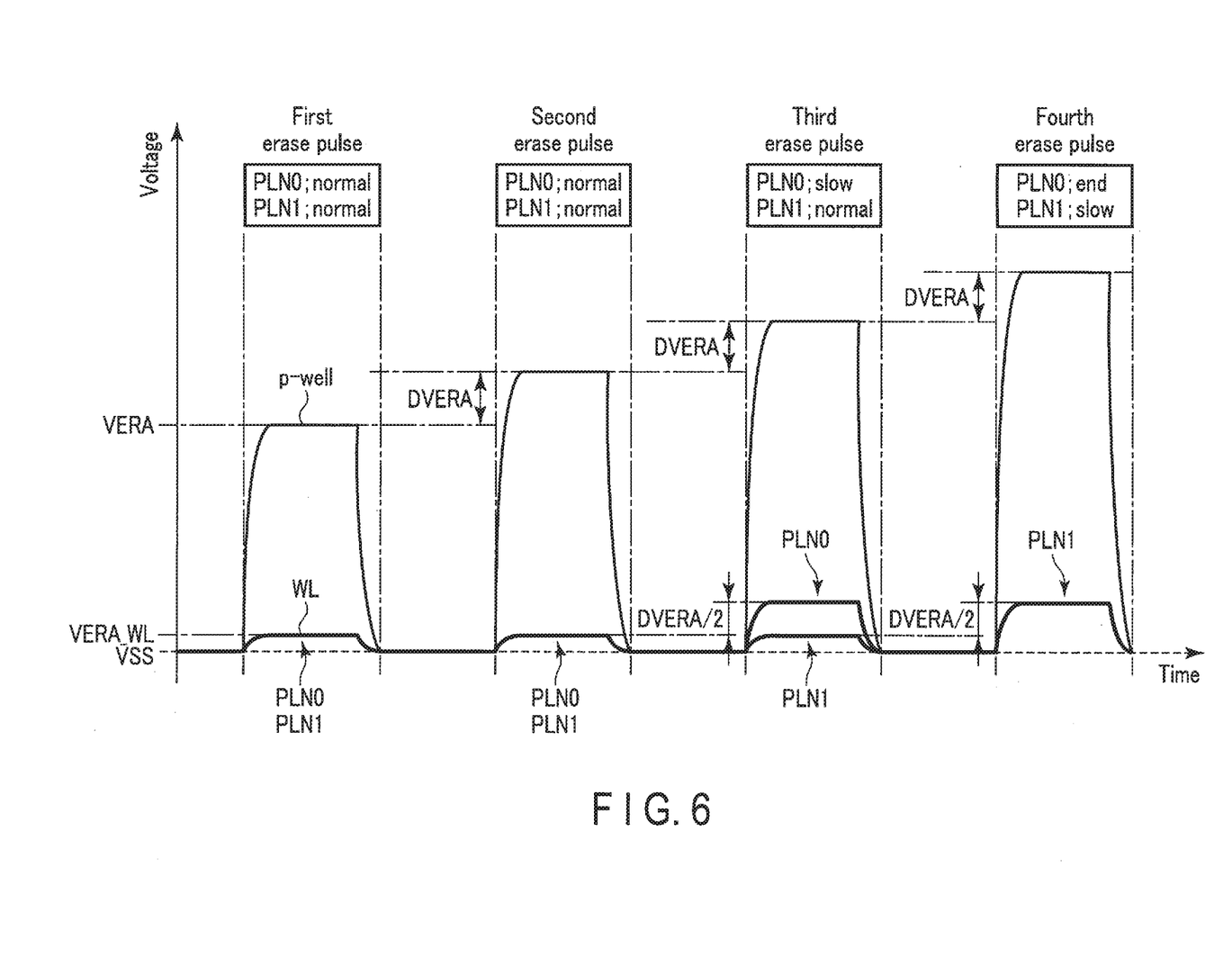
FIG. 6 is a timing chart showing an example of erase pulse application in the semiconductor memory device according to the first embodiment.

Below is a description of the relationship in potential between interconnects in erase pulse application. FIG. 6 is a timing chart showing an example of erase pulse application in the semiconductor memory device according to the first embodiment. In the example of FIG. 6, the erase operation is performed in the planes PLN0 and PLN1, the erase operation in the PLN0 is completed by applying the third erase pulse, and the erase operation in the PLN1 is completed by applying a fourth erase pulse. In this embodiment, the control circuit 121 performs the erase operation in the two planes PLN, but it can be performed in one of the planes.

First, a voltage of each interconnect when the normal mode is selected will be described, paying attention to the first erase pulse application. The well driver 115 applies a voltage VERA (e.g., 14 V) as an erase pulse to the p-type well region of the semiconductor substrate on which selected block BLK of each plane PLN are provided. The row decoder 112 applies a voltage VERA_WL (e.g., 0.5 V) to all of the word lines WL of a block BLK to be erased. The voltage VERA_WL is much lower than the voltage VERA in order to draw electrons out of the charge accumulation layer. In accordance with a difference in potential between the voltages VERA and VERA_WL, electrons are drawn out of the charge accumulation layer of the memory cell transistor MT and data is erased. Though the voltage of a bit line BL, a source line SL, and select gate lines SGD and SGS are not shown in FIG. 6, those lines are, for example, electrically floating. Or the row decoder 112 may apply the voltage VERA to the select gate lines SGD and SGS.

Next, the step-up of the voltage VERA will be described, paying attention to the second erase pulse application. In the second erase pulse application, the normal mode is selected in both the planes PLN0 and PLN1. The erase pulse is stepped up with a fixed step-up width in accordance with the number of erase loops, irrespective of, e.g., the erase mode. At this time, the step-up voltage is represented as DVERA (e.g., 0.4 V).

Next, the voltage of the word line WL in slow mode will be described, paying attention to the third erase pulse. In the case of the third erase pulse application, the slow mode is selected in the plane PLN0 and the normal mode is selected in the plane PLN1. The voltage applied to the word line WL in slow mode differs from that in normal mode. Specifically, when the slow mode is selected, the voltage VERA_WL+(DVERA/2) is applied to the word line WL. When the voltage of the word line WL increases by +DVERA/2 (e.g., 0.2 V), even if the voltage or the erase pulse increases by +DVERA (e.g., 0.4 V), the step-up width of a difference in potential between the word line WL and the p-type well, or between the control gate and back gate of the memory cell transistor MT is expressed as follows: DVERA−(DVERA/2)=DVERA/2 (e.g., 0.2 V). Accordingly, the step-up width of an effective erase pulse is decreased. The voltage added to the word line WL in slow mode need not be DVERA/2 but is lower than DVERA, and the step-up width of the effective erase pulse has only to be smaller than DVERA.

In the case of the fourth erase pulse, the erase operation of the plane PLN0 is completed and the slow mode is selected in the plane PLN1. Thus, the voltage VERA_WL+(DVERA/2) is applied to the word line WL of the plane PLN1.

When the second erase verify is not, passed after an erase pulse is applied in slow mode, the control circuit 121 may select the slow mode again and apply the erase pulse. In this case, the voltage of the word line WL can be stepped up to a previous state continuously by (+DVERA/2) after the slow mode, such as a voltage VERA_WL+(DVERA/2)+(DVERA/2) and a voltage VERA_WL+(DVERA/2)+(DVERA/2)+(DVERA/2) in the next pulse. The voltage can also be stepped up to a previous state continuously under greater slow control after the slow mode, such as a voltage VERA_WL, +(DVERA/2)+(DVERA×3/4) and a voltage VERA_WL+(DVERA/2)+(DVERA×3/4)+(DVERA×7/8) in the next pulse.

When the slow mode is selected to apply an erase pulse, the erase operation can be completed and the first erase verify and the second erase verify can be omitted, irrespective of a result of the first erase verify and the second erase verify.

1.2.4 Voltage of Each Interconnect in Erase Verify

Figure 7:
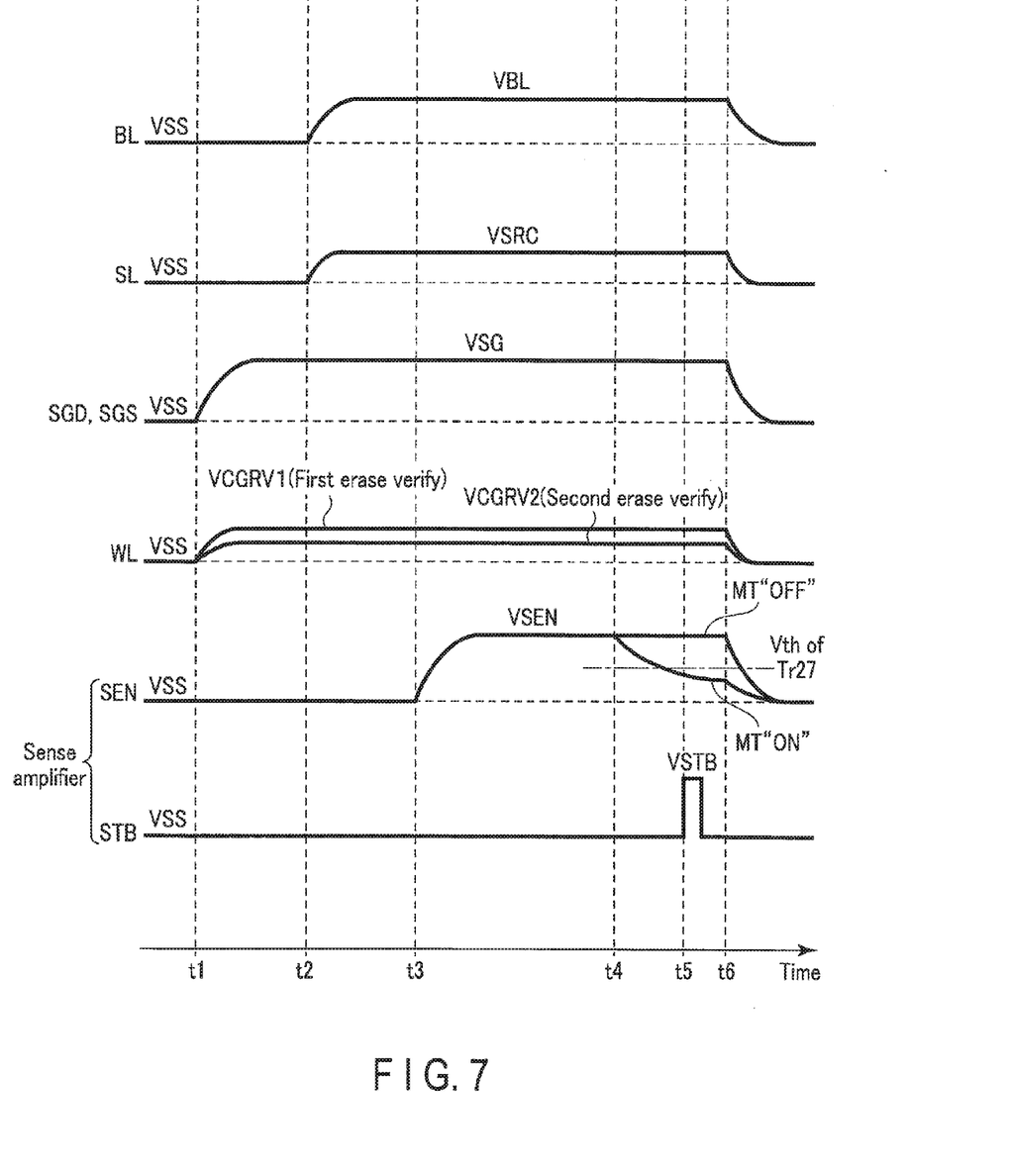
FIG. 7 is a timing chart showing a voltage of each interconnect in erase verify in the semiconductor memory device according to the first embodiment.

Below is a description of the voltage of each interconnect in erase verify. FIG. 7 is a timing chart showing a voltage of each interconnect in erase verify in the semiconductor memory device according to the first embodiment. The voltages of the interconnects in the first erase verify and the second erase verify are the same, except for the word line WL.

As shown in FIG. 7, first, at time t1, the row decoder 112 applies a voltage VSG to the select gate lines SGD and SGS of the selected block BLK. The voltage VSG is a voltage for turning on the select transistors ST1 and ST2. The row decoder 112 also applies a voltage corresponding to the verify level to all of the word lines WL of the selected block BLK. Specifically, when the first erase verify is performed, a voltage VCGRV1 (e.g., voltage VAH) is applied to the word line WL and when the second erase verify is performed, a voltage VCGRV2 (e.g., voltage VAL) is applied to the word line WL. The voltages VCGRV1 and VCGRV2 are voltages corresponding to the verify level VAH and VAL and have the following relationship: VCGRC1>VCGRV2. For example, in the first erase verify, when the threshold voltage of a memory cell transistor MT to be verified is higher than the voltage VCGRV1, the memory cell transistor MT is turned off and when the threshold voltage is lower than the voltage VCGRV1, the memory cell transistor MT is turned on. The voltages VCGRV1 and VCGRV2 are caused to vary according to, for example, the backgate (p-type well region) voltage of the memory cell transistor MT. Specifically, for example, when the backgate voltage of the memory cell transistor MT is 0 V, VCGRV1=VAH and VCGRV2=VAL and when the backgate voltage is VBG, VCGRV1=VAH+VBG and VCGRV2=VAL+VBG.

Next, at time t2, the sense amplifier 113 applies a voltage VBL to the bit line BL. More specifically, in the sense amplifier unit 130, the signals BLS and BLX are set at an "H" level, the signal INV_S is set at an "L" level, and the transistors 20, 22 and 29 are turned on. Then, the voltage of the signal BLC becomes VBL+Vt21 (Vt21 is the threshold voltage of the transistor 21) and thus the sense amplifier unit 130 applies the voltage VBL to its corresponding bit line BL.

The source line driver 114 applies a voltage VSRC (<VBL) to the source line SL.

Next, at time t3, the signal HLL of the sense amplifier unit 130 is set at an "H" level. Accordingly, the transistor 24 is turned on and a voltage VSEN (>voltage of node SCOM) is applied to the node SEN.

Next, at time t4, the signal HLL of the sense amplifier unit 130 is set at an "L" level and the transistor 24 is turned off. The signal XXL is set at an "H" level and the transistor 23 is turned on. Thus, in the selected block BLK, when the memory cell transistors MT of the NAND string 119 are all turned on, the node SEN is discharged because current flows from the node SEN to the bit line BL. When even one of the memory cell transistors MT of the NAND string 119 is turned off, the node SEN is almost maintained at the original voltage VSEN because no current flows from the node SEN to the bit line BL.

Next, at time t5, in the sense amplifier unit 130, the signal STB is set at an "H" level to allow data strobe. In other words, read data is transferred to the latch circuit SDL. Specifically, the transistor 27 is turned on if the voltage of the node SEN is set at an "H" level (a voltage higher than the threshold voltage Vth of the transistor 27). Thus, the "L" level is transferred to the latch circuit because current flows from the latch circuit SDL via the bus LBUS. If the voltage of the node SEN is set at an "L" level, the transistor 27 is turned off and thus the bus LBUS is maintained at the "H" level of the Initial state. In other words, the latch circuit SDL is maintained at the "H" level.

The erase verify determination circuit 117 determines that the erase verify is passed if the number of "H" level data which each latch circuit SDL holds is greater than or equal to a preset number.

Next, at time t6, a recovery process is performed to reset the voltage of each interconnect.

1.3 Advantage of First Embodiment

If the step-up width of an erase pulse increases in a general erase operation, the number of erase loops can be reduced and thus the erase operation time can be shortened. If, however, the step-up width of an erase pulse increases, over-erase (a state in which the threshold voltage is greatly shifted to the negative voltage side) will easily occur. Further, a high voltage is suddenly applied to a gate insulation film of the memory cell transistor MT. Thus, the gate insulation film of the memory cell transistor MT easily degrades. If the gate insulation film of the memory cell transistor MT degrades, write and erase characteristics will vary (degrade). If the characteristics greatly vary, neither a write operation nor an erase operation can be performed normally, and the write and erase operations are decreased in reliability.

If the step-up width decreases, the memory cell transistors MT can be suppressed from degrading, but the number of erase loops increases and the erase operation time tends to lengthen; consequently, it is likely that the next operation will be delayed. If, for example, there is a limit to the erase operation time, it will be difficult to complete the erase operation within a fixed period of time. Accordingly, the semiconductor memory device is decreased in throughput.

In a general product, therefore, the step-up width of an erase pulse is set based on a tradeoff between the reliability and the throughput.

In contrast, according to the structure of the first embodiment, the semiconductor memory device has two erase modes of the normal mode and the slow mode. The semiconductor memory device also has two erase verify operations of first erase verify and second erase verify. Thus, the semiconductor memory device can improve in reliability almost without decreasing in throughput. Below is a specific description of this advantage.

In the first embodiment, the first erase verify and the second erase verify are performed by setting the verify level VAH of the first erase verify is set higher than the verify level VAL of the second erase verify. It is seen that when the first erase verify is failed, the threshold voltage of the memory cell transistor MT widely differs from a target threshold level VA (erase level); thus, the normal mode in which the amount of variation in threshold voltage is large, is selected and an erase pulse is applied. It is also seen that when the first erase verify is passed and the second erase verify is failed, the threshold voltage is slightly higher than the erase level; thus, the slow mode in which the amount of variation in threshold voltage is small, is selected and an erase pulse is applied. Specifically, for example, in the last erase pulse application, an erase pulse is applied in one of the slow and normal modes according to the threshold distribution of the memory cell transistors MT. Thus, the amount of variation in threshold voltage can be decreased in erase pulse application without increasing the number of erase pulses. It is thus possible to suppress over-erase and also suppress the memory cell transistors MT from degrading. Therefore, the semiconductor memory device can be improved in reliability.

Further, it is possible to decreasing the amount of variation in threshold voltage in erase pulse application without increasing the number of erase pulses. Therefore, the semiconductor memory device can be suppressed from decreasing in its throughput.

Further, it is possible to reduce the number of write pulse applications when the next write operation is performed by suppressing over-erase. Therefore, the semiconductor memory device can be improved in throughput in the write operation.

Moreover, according to the structure of the first embodiment, in slow mode, the voltage of a word line WI is stepped up to decrease a difference in potential between the control and back gates of a memory cell transistor MT and also decrease the amount of variation in threshold voltage due to erase. Thus, for example, even though the same erase operation is performed in a plurality of planes PLN, the amount of variation in threshold voltage can be adjusted by the voltage of the word line WI, for each of the planes PLN. Moreover, the well driver 115 is able to apply the same erase pulse (VERA) to a plurality of planes PLN; thus, a charge pump for stepping up a voltage need not be provided for each of the planes PLN, but the circuit arrangement can be simplified. Therefore, the area of chips can be suppressed from increasing.

2. Second Embodiment

A semiconductor memory device according to a second embodiment will be described. The second embodiment differs from the first embodiment in its flowchart of an erase operation. Below is a description of only points different from those of the first embodiment.

2.1 Flow of Whole Erase Operation

Figure 8:
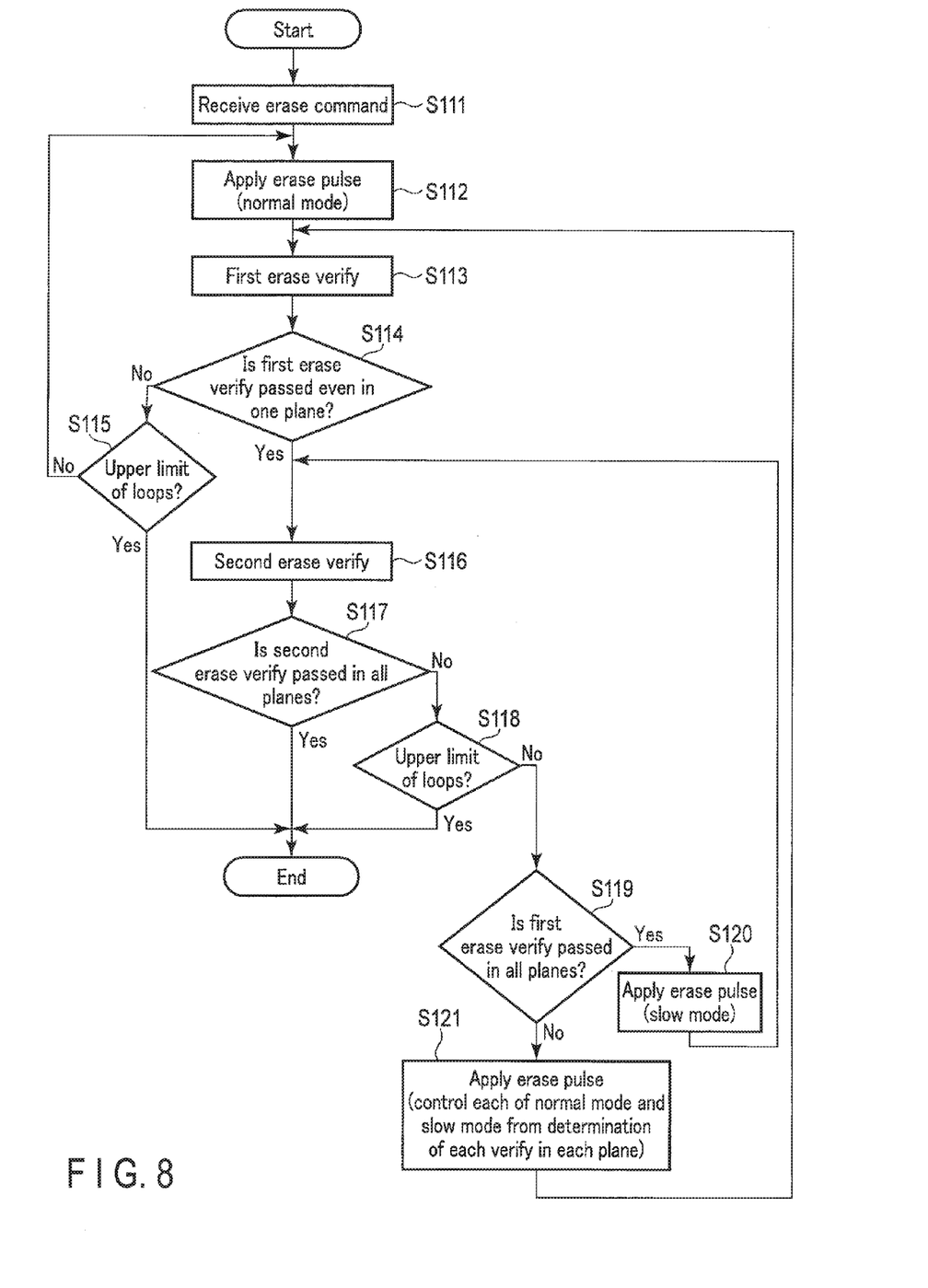
FIG. 8 is a flowchart showing an erase operation in a semiconductor memory device according to a second embodiment.

Below is a description of a flow of the whole erase operation in the second embodiment. FIG. 8 is a flowchart showing an erase operation in the semiconductor memory device according to the second embodiment.

As shown in FIG. CS, first, a control circuit 121 performs the same operations to the first erase verify as in steps S101 to S103 of FIG. 4 (steps S111 to S113).

When the first erase verify is failed in all of the planes PLN to be erased (step S114_No), the control circuit 121 determines whether the number of erase loops reaches preset upper limit (step S115).

If the erase loops reach the upper limit (step S115_Yes), the control circuit 121 completes the erase operation and notifies an external controller that the erase operation was not completed normally.

If the erase loops do not reach the upper limit (step S113_No), the control circuit 121 returns to step S112 to elect the normal mode again in all of the planes PLN and apply an erase pulse.

When the first erase verify passed in at least one plane PLN (step S114_Yes), the second erase verify is performed (step S116).

When the second erase verify is failed in at least one plane PLN (step S117_No), the control circuit 121 determines whether the number of erase loops reaches a preset upper limit (step S118).

If the erase loops reach the upper limit (step S118_Yes), the control circuit 121 completes the erase operation and notifies the external controller that the erase operation was not completed normally.

If the erase loops do not reach the upper limit (step S118_No), the control circuit 121 confirms whether the first erase verify is passed in all of the planes PLN (step S119).

If the first erase verify is passed in all of the planes PLN (step S119_Yes), the control circuit 121 selects the slow mode in all of the planes PLN and applies an erase pulse (Step S120). Then the control circuit 121 returns to step 116 to perform the second erase verify.

If the first erase verify is failed in at least one plane PLN (step S119_No), the control circuit 121 selects one of the normal mode, slow mode and erase operation completion for each plane PLN in accordance with a result of an erase verify result and applies the voltages corresponding to the selected mode (step S121). Then the control circuit 121 returns to step 113 to perform the first erase verify.

If the second erase verify is passed (step S117_Yes), the erase operation is completed.

2.2 Advantage of Second Embodiment

The structure of the second embodiment brings about the same advantage as that of the first embodiment.

With the structure according to the second embodiment, furthermore, the second erase verify can be omitted when the first erase verify is failed in all planes PLN in an erase loop, and the first erase verify can be omitted when the first erase verify is passed in all planes PLN. Thus, the number of times of erase verify can be suppressed from increasing in one erase loop; accordingly, the erase operation time can be suppressed further from being delayed. Therefore, the semiconductor memory device can be suppressed from decreasing in its throughput.

3. Third Embodiment

A semiconductor memory device according to a third embodiment will be described. The third embodiment differs from the first embodiment in the method of first erase verify and second erase verify. Below is a description of only points different from those of the first embodiment.

3.1 Erase Verify

Figure 9:
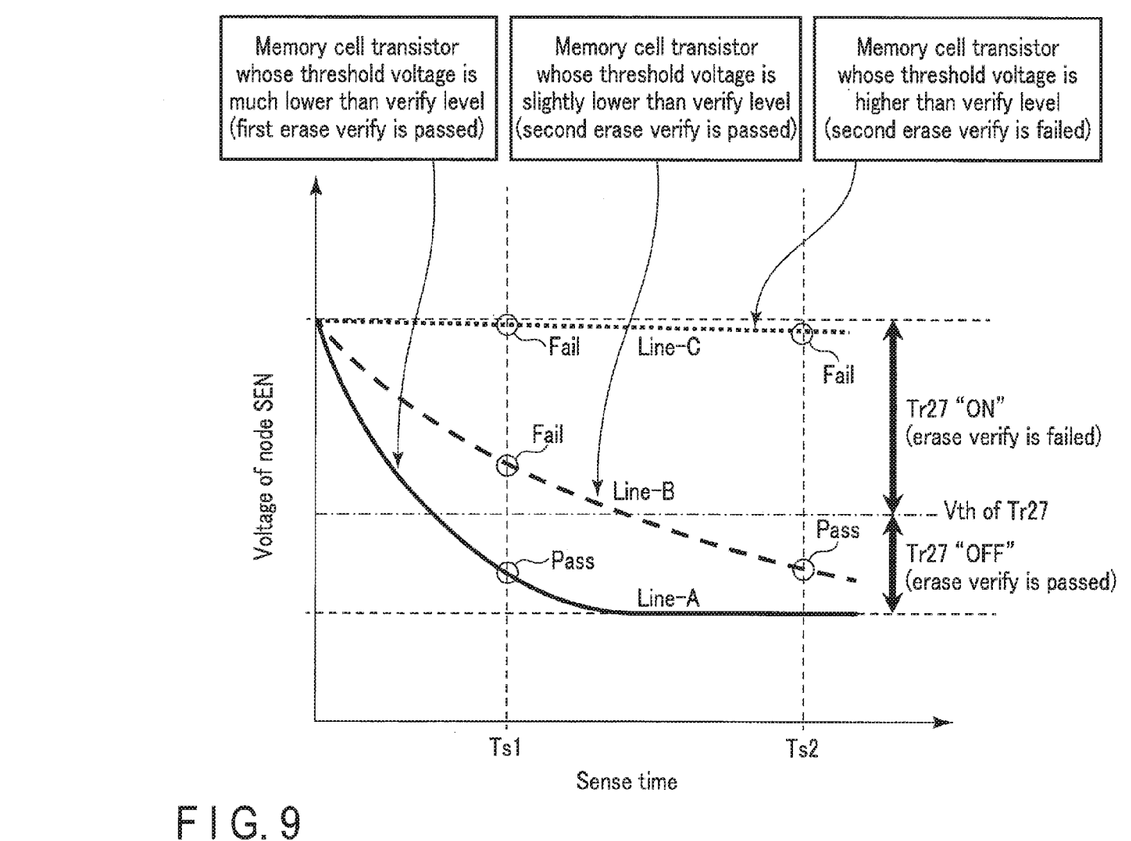
FIG. 9 is a graph showing a relationship between a voltage of a node SEN and sense time in erase verify in a semiconductor memory device according to a third embodiment.

Below is a description of the first erase verify and the second erase verify in the third embodiment. In the third embodiment, the first erase verify and second erase verify use the same verify level (voltage VCGRV) and differ in sense time for pass/fail determination of erase verify. In the erase verify operation, the sense time is period from the start of discharge of a node SEN when a transistor 24 is turned off and a transistor 23 is turned on until data strobe with a signal STB at an "H" level in a sense amplifier unit 130.

FIG. 9 is a graph showing a relationship between the sense time and the voltage of the node SEN in erase verify in the semiconductor memory device according to the third embodiment. In the example of FIG. 9, data strobe at sense time Ts1 is defined as the first erase verify and data strobe at sense time Ts2 is defined as the second erase verify. As the length of the sense time, there is a relationship of Ts1<Ts2.

As shown in FIG. 9, when the threshold voltage of a memory cell transistor MT is much lower than the verify level (hereinafter the verify level in the third embodiment will be referred to as VAL, for example), the memory cell transistor MT is in a strong on-state. In this memory cell transistor MT, the threshold voltage is much lower than the voltage VCGRV and thus the amount of current flowing from a bit line BL to a source line SL is relatively large. Accordingly, the potential of the node SEN rapidly lowers (solid line "Line-A" in FIG. 9). Therefore, when the current is sensed at sense time Ts1, a transistor 27 is turned off and a latch circuit SDL is set at an "H" level in the sense amplifier unit 130. Consequently, a control circuit 121 determines that the first erase verify is passed and completes the erase operation. Hereinafter, a state in which the threshold voltage is much lower than the verify level VAL, will be referred to as "a state in which the threshold voltage is lower than voltage V1". The voltage V1 is lower than the verify level VAL and is higher than the upper limit of the threshold voltage of the memory cell transistor MT that passes in the erase verify at sense time Ts1.

When the threshold voltage of the memory cell transistor MT is slightly lower than the verify level VAL, the memory cell transistor MT is in a weak on-state. Hereinafter, a state in which the threshold voltage is slightly lower than the verify level VAL, will be referred to as "a state in which the threshold voltage is higher than or equal to voltage V1 and which is lower than voltage VAL". In this memory cell transistor MT, a difference in potential between the voltage VCGRV and the threshold voltage is small and thus the amount of current flowing from the bit line BL to the source line SL is relatively small. Accordingly, the potential of the node SEN gradually lowers (broken line "Line-B" in FIG. 9). Therefore, when the current is sensed at sense time Ts1, the transistor 27 is turned on and the latch circuit SDL is set at an "L" level in the sense amplifier unit 130. Consequently, the control circuit 121 determines that the first erase verify is failed. However, when current is sensed at sense time Ts2, the potential of the node SEN is made lower than the threshold voltage of the transistor 27 and the transistor 27 is turned off. Thus, the latch circuit SDL is set at an "H" level. Consequently, the control circuit 121 determines that the first erase verify is failed and the second erase verify is passed. As a result, the control circuit 121 selects the slow mode and applies a subsequent erase pulse.

When the threshold voltage of the memory cell transistor MT is higher than or equal to the verify level VAL, the memory cell transistor MT is in an off state and thus almost no current flows from the bit line BL to the source line SL. Thus, the transistor 27 is maintained in an on state (dotted line "Line-C in FIG. 9) even at sense time Ts2. Therefore, the latch circuit SDL is set at an "L" level. As a result, the control circuit 121 determines that the second erase verify is failed. Then, the control circuit 121 selects the normal mode and applies a subsequent erase pulse.

3.2 Voltage of Each Interconnect in Erase Verify

Figure 10:
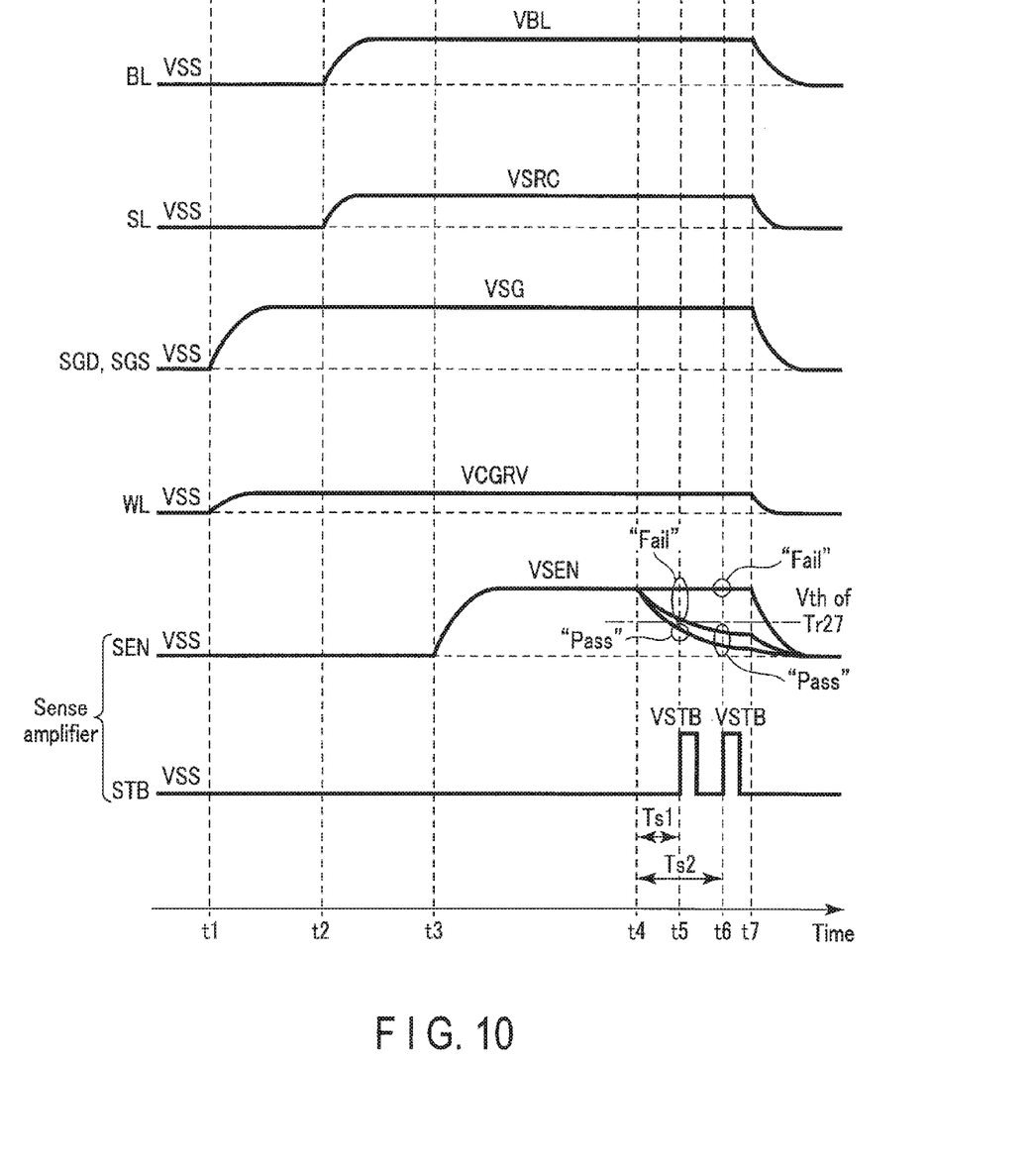
FIG. 10 is a timing chart showing a voltage of each interconnect in erase verify in the semiconductor memory device according to the third embodiment.

Below is a description of the voltage of each interconnect, in erase verify. FIG. 10 is a timing chart showing a voltage of each interconnect in erase verify in the semiconductor memory device according to the third embodiment. Below is a description of only points different from those in FIG. 7 of the first embodiment.

As shown in FIG. 10, the voltages applied to the hit line BL, source line SL and select gate lines SGD and SGS are the same as those in FIG. 7.

At time t1, a row decoder 112 applies a voltage VCGRV to the word line WL of a selected block BLK.

At time t3, in the sense amplifier unit 130, a voltage VSEN is applied to the node SEN.

At time t4, the node SEN starts to be discharged.

At time t5, or at sense time Ts1, a signal STB is set at an "H" level and data strobe is performed. Accordingly, a result of the first erase verify is transferred to the latch circuit SDL. Specifically, if the voltage of the node SEN is set at an "H" level (which is higher than the threshold voltage Vth of the transistor 27), the latch circuit SDL is set at an "L" level, and the control circuit 121 determines that the first verify is failed. If the voltage of the node SEN is set at an "L" level, the latch circuit SDL is set at an "H" level, and the control circuit 121 determines that the first verify is passed.

At time t6, or at sense time Ts2, the signal STB is set at an "H" level and data strobe is performed. Accordingly, a result of the second erase verify is transferred to the latch circuit SDL. Specifically, if the voltage of the node SEN is set at an "H" level (which is higher than the threshold voltage Vth of the transistor 27), the latch circuit SDL is set at an "L" level, and the control circuit 121 determines that the second verify is failed. If the voltage of the node SEN is set at an level, the latch circuit SDL is set at an "H" level, and the control circuit 121 determines that the second verify is passed.

3.3 Advantage of Third Embodiment

The structure of the third embodiment brings about the same advantage as that of the first embodiment.

With the structure according to the third embodiment, furthermore, the first erase verify and the second erase verify can be determined by performing data strobe two times at different sense times in one erase verify operation. More specifically, it is possible to determine whether the threshold distribution of memory cell transistors MT is much lower than the verify level (lower than voltage V1) or slightly lower than the verify level (higher than or equal to voltage V1 and lower than voltage VAL) or higher than the verify level by performing data strobe two times at two sense times Ts1 and Ts2. Since, therefore, the erase verify can be determined two times in one verify operation, the number of erase verify operations in one erase loop can be one. Thus, the erase operation time can be suppressed further from being delayed. Therefore, the semiconductor memory device can be suppressed from decreasing in its throughput.

4. Modification, Etc.

The semiconductor memory device according to the foregoing embodiments includes a memory cell transistor (MT in FIG. 1) and a word line (WL in FIG. 1) coupled to the memory cell transistor. The threshold voltage of the memory cell transistor is shifted to a negative voltage side by applying an erase pulse (VERA in FIG. 6) to the memory cell transistor. When the erase pulse is applied, if the threshold voltage of the memory cell transistor is higher than or equal to a first voltage (VAH in FIG. 5), a second voltage (VERA_WL in FIG. 6) is applied to the word line (normal mode). If the threshold voltage of the memory cell transistor is lower than the first voltage and higher than or equal to a third voltage (VAL in FIG. 5) which is lower than the first voltage, a fourth voltage (VERA_WL+DVERA/2 in FIG. 6) which is higher than the second voltage is applied to the word line (slow mode).

The foregoing embodiments are applied to provide a semiconductor memory device that can be improved in reliability. The embodiments are not limited to the above description, but various modifications can be made to the embodiments.

In the foregoing embodiments, for example, a sense amplifier unit of a voltage sense system can be employed.

Furthermore, in the foregoing embodiments, the first erase verify and the second erase verify are performed, but the erase verify can be performed under three or more conditions. In this case, three or more conditions are set for the voltage of a word line in erase pulse application, thereby making it possible to perform an erase operation with less over-erase. For example, a semiconductor memory device has three erase modes of the normal mode, a first slow mode and a second slow mode and also has first, erase verify, second erase verify and third erase verify. The verify levels in the first erase verify, second erase verify and third erase verify are defined as first to third verify levels which have a relationship of "first verify level">"second verify level">"third verify level". In this case, the normal mode is selected to apply a voltage VERA_WL to the word line WE when the first erase verify is failed, the first slow mode is selected to apply, for example, a voltage VERA_WL+(DVERA/4) to the word line WI when the second erase verify is failed, and the second slow mode is selected to apply, for example, a voltage VERA_WL+(DVERA/2) to the word line when the third erase verify is failed.

Furthermore, in the foregoing embodiments, the CG selector 118 of each of the planes PLN selects one of the two CG driver lines CGDV0 and CGDV1 to select a voltage to be applied to a row decoder 112. However, the CG driver 116 may select a voltage to be applied for each row decoder 112, and the voltage may be controlled by a clamp transistor provided at a control date line CG for connecting the row decoder 112 and the CG driver 116. A method of applying different voltages to the row decoders 112 of the respective planes PLN is not particularly limited to the embodiments.

Furthermore, in the foregoing embodiments, the first erase verify and the second erase verify may be determined by changing the discharge speed of the node SEN at the same sense time by varying a precharge voltage with which a bit line BL is charged.

The foregoing embodiments can also be applied to a three-dimensional stacked NAND flash memory in which memory cell transistors are stacked vertically on a semiconductor substrate. They can be applied to a variety of semiconductor memory devices for erasing data, regardless of whether they are volatile memories or nonvolatile memories.

Furthermore, the terms "connect" and "couple" in the foregoing embodiments include an indirect connection interposing an element such as a transistor and a resistor.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a memory cell transistor; and
   a word line coupled to the memory cell transistor,
   wherein a threshold voltage of the memory cell transistor is shifted to a negative voltage side by applying an erase pulse to the memory cell transistor,
   when the erase pulse is applied, if the threshold voltage of the memory cell transistor is higher than or equal to a first voltage, a second voltage is applied to the word line, and
   if the threshold voltage of the memory cell transistor is lower than the first voltage and higher than or equal to a third voltage which is lower than the first voltage, a fourth voltage which is higher than the second voltage is applied to the word line.

2. The device according to claim 1, wherein the erase pulse is stepped up, and
   the erase pulse has a step-up width that is larger than a potential difference between the second voltage and the fourth voltage.

3. The device according to claim 1, wherein the second voltage and the fourth voltage are lower than a voltage of the erase pulse, and
   a potential difference between the voltage of the erase pulse and the second voltage is larger than a potential difference between the voltage of the erase pulse and the fourth voltage.

4. The device according to claim 1, wherein an amount of shift of the threshold voltage of the memory cell transistor by applying the erase pulse is smaller when the fourth voltage is applied to the word line than when the second voltage is applied to the word line.

5. The device according to claim 1, wherein the erase pulse is applied to a hack gate of the memory cell transistor.

6. The device according to claim 1, wherein a first erase verify and a second erase verify are performed after the erase pulse is applied,
   a fifth voltage is applied to the word line when the first erase verify is performed,
   a sixth voltage which is lower than the fifth voltage is applied to the word line when the second erase verify is performed, the second voltage is applied to the word line when the first erase verify is failed, and the fourth voltage is applied to the word line when the first erase verify is passed and the second erase verify is failed.

7. The device according to claim 6, wherein the first voltage is equal to the fifth voltage, and the third voltage is equal to the sixth voltage.

8. The device according to claim 6, wherein it is determined that the first erase verify is failed when the threshold voltage of the memory cell transistor is higher than or equal to the first voltage, and it is determined that the second erase verify is failed when the threshold voltage of the memory cell transistor is higher than or equal to the third voltage.

9. The device according to claim 6, further comprising a sense amplifier coupled to the memory cell transistor via a bit line, wherein the sense amplifier includes a first interconnect for sensing a current flowing in the bit line, and in the determination of one of the first erase verify and the second erase verify, it is determined that the one of the first erase verify and the second erase verify is failed when a voltage of the first interconnect is higher than or equal to a seventh voltage, and it is determined that the one of the first erase verify and the second erase verify is passed when the voltage of the first interconnect is lower than the seventh voltage.

10. The device according to claim 6, further comprising a determination circuit which outputs a first signal based upon results of the first erase verify and the second erase verify, wherein the determination circuit outputs a first logic level when the first erase verify is failed and outputs a second logic level when the first erase verify is passed and the second erase verify is failed.

11. The device according to claim 1, further comprising a sense amplifier coupled to the memory cell transistor via a bit line, wherein the first erase verify and the second erase verify are performed after the erase pulse is applied, the first erase verify is determined when a sense time in the sense amplifier is a first period, the second erase verify is determined when the sense time in the sense amplifier is a second period which is longer than the first period, the second voltage is applied to the word line when the erase pulse is applied if the first erase verify and the second erase verify are failed; and the fourth voltage is applied to the word line when the erase pulse is applied if the first erase verify is failed and the second erase verify is passed.

12. The device according to claim 11, wherein it is determined that the first erase verify is failed when the threshold voltage of the memory cell, transistor is higher than or equal to the third voltage, and it is determined that the second erase verify is failed when the threshold voltage of the memory cell transistor is higher than equal to the first voltage.

13. The device according to claim 11, wherein the sense amplifier includes a first interconnect for sensing a current flowing in the bit line, and in the determination of one of the first erase verify and the second erase verify, it is determined that the one of the first erase verify and the second erase verify is failed when a voltage of the first interconnect is higher than or equal to a fifth voltage and it is determined that the one of the first erase verify and the second erase verify is passed when the voltage of the first interconnect is lower than the fifth voltage.

14. The device according to claim 1, wherein the fourth voltage applied to the word line is stepped up in accordance with the number of applications of the erase pulse if the erase pulse is applied a plurality of times while the threshold voltage of the memory cell transistor is lower than the first voltage and higher than or equal to the third voltage which is lower than the first voltage.

\* \* \* \* \*